United States Patent
Bandic et al.

[11] Patent Number: 6,144,045
[45] Date of Patent: Nov. 7, 2000

[54] HIGH POWER DEVICES BASED ON GALLIUM NITRIDE AND ALUMINUM GALLIUM NITRIDE SEMICONDUCTOR HETEROSTRUCTURES

[75] Inventors: Zvonimir Z. Bandic, Pasadena; Eric C. Piquette, Glendale; Thomas C. McGill, Pasadena, all of Calif.

[73] Assignee: California Institute of Technology, Pasadena, Calif.

[21] Appl. No.: 09/285,484

[22] Filed: Apr. 2, 1999

Related U.S. Application Data

[60] Provisional application No. 60/080,714, Apr. 3, 1998.

[51] Int. Cl.$^7$ ..................................................... H01L 29/74
[52] U.S. Cl. ......................... 257/107; 257/108; 257/113; 257/114; 257/615
[58] Field of Search ..................................... 257/615, 107, 257/108, 110, 113, 114, 115, 119

[56] References Cited

U.S. PATENT DOCUMENTS 5,663,580  9/1997  Harris et al. ............................. 257/113

OTHER PUBLICATIONS

SZE, S.M., "Physics of Semiconductor Devices, 2nd Edition," 1981, pp. 190–242.

Primary Examiner—Minh Loan Tran
Attorney, Agent, or Firm—Blakely, Sokoloff, Taylor & Zafman LLP

[57] ABSTRACT

High power thyristor-type devices comprising a first layer of p-type doped semiconductor alloy aluminum gallium nitride, a second layer of n-type doped aluminum gallium nitride with lower aluminum content than the first layer, a third layer of p-type doped aluminum gallium nitride with a higher aluminum content than the second layer, and a fourth layer of aluminum gallium nitride of n-type doping. The difference in hole and electron energies (band offsets) across the interface between aluminum gallium nitride and gallium nitride are such that hole and electron transfer are enhanced from aluminum gallium nitride to gallium nitride, or hole and electron transfer are suppressed from gallium nitride to aluminum gallium nitride. Aluminum content in layers 1 and 2 is chosen such that hole transfer in the forward biased conduction state of the device is enhanced, and suppressed in the reverse biased blocking state of the device. Aluminum content in layers 2 and 3 is chosen such that hole transfer in the forward biased blocking state of the device is suppressed, which reduces leakage current and enhances hole transfer into layer 2 when the device is changing from the forward biased blocking state to the forward biased conduction state. Triggering of the device may be provided by a gate contact to the third layer. Various exemplary embodiments are disclosed.

27 Claims, 2 Drawing Sheets

HIGH POWER DEVICES BASED ON GALLIUM NITRIDE AND ALUMINUM GALLIUM NITRIDE SEMICONDUCTOR HETEROSTRUCTURES

CROSS-REFERENCE TO RELATED APPLICATION

This application claims benefit of U.S. Provisional Application No. 60/080,714 filed Apr. 3, 1998.

STATEMENT OF GOVERNMENT INTEREST

The U.S. Government has certain rights in this invention pursuant to Grant No. N00014-92-J-1845 awarded by the U.S. Navy.

BACKGROUND OF THE INVENTION

1. Field of the Invention

The present invention relates to the field of thyristors and thyristor-like devices.

2. Prior Art

Thyristors or thyristor-like devices are a general family of semiconductor devices that exhibit bistable characteristics and can be switched between a high impedance, low current off state and a low impedance, high current on state. Such devices are frequently used for current switching in high power applications, as the low impedance on state and the high impedance off state minimize the power dissipation in either operating state. Obviously, however, further reductions in the on impedance are desirable to reduce the power dissipation by such devices and to potentially increase the current carrying capacity thereof. Also, further increases in the off impedance will further reduce the reverse bias leakage current, a counterproductive current in most applications.

A good discussion of the principles and structures of thyristors is provided in Chapter 4, starting on page 190, of "Physics of Semiconductor Devices", second edition, by S. M. Sze. Such devices are generally four layer pnpn silicon devices having three pn junctions in series. An anode connection is provided through an ohmic contact with the first (p) layer, and a cathode connection is provided by an ohmic contact to the fourth (n) layer. Gate connections may be provided to either or both the second (n) layer and the third (p) layer, though normally in a three terminal triggerable device, the third or gate connection is made to the third (p) layer. The basic structure provides a thyristor like device in the form of a triggerable unidirectional switch, though alternate configurations of the basic structure can provide bi-directional switches and related devices (see chapter 4 of Sze referred to above for some examples of such other thyristor-like devices).

BRIEF SUMMARY OF THE INVENTION

High power thyristor-type devices comprising a first layer of p-type doped semiconductor alloy aluminum gallium nitride, a second layer of n-type doped aluminum gallium nitride with lower aluminum content than the first layer, a third layer of p-type doped aluminum gallium nitride with a higher aluminum content than the second layer, and a fourth layer of aluminum gallium nitride of n-type doping. The difference in hole and electron energies (band offsets) across the interface between aluminum gallium nitride and gallium nitride are such that hole and electron transfer are enhanced from aluminum gallium nitride to gallium nitride, or hole and electron transfer are suppressed from gallium nitride to aluminum gallium nitride. Aluminum content in layers 1 and 2 is chosen such that hole transfer in the forward biased conduction state of the device is enhanced, and suppressed in the reverse biased blocking state of the device. Aluminum content in layers 2 and 3 is chosen such that hole transfer in the forward biased blocking state of the device is suppressed, which reduces leakage current and enhances hole transfer into layer 2 when the device is changing from the forward biased blocking state to the forward biased conduction state.

Triggering of the device is provided by a gate contact to the third layer. The four-layer structure of the present invention may be used to fabricate various thyristor-like devices.

Various exemplary embodiments and methods of fabrication are disclosed.

DETAILED DESCRIPTION OF THE PREFERRED EMBODIMENT

The present invention comprises thyristor-like devices comprising a four layer pnpn structure, wherein all four layers comprise aluminum gallium nitride crystaline layers appropriately doped to provide pn junctions between adjacent layers. In the preferred embodiment, the second (n) layer has a lower aluminum content than the first layer, and the third (p) layer has a higher aluminum content than the second layer. In that regard, it is to be understood that as used herein, references to "higher" or "lower" aluminum content are made not in the absolute sense, but rather in relation to the proportion of aluminum relative to gallium present in the respective layer. More specifically, aluminum gallium nitride may be expressed as $Al_xGa_{1-x}N$, where x can range from zero to one. References to "higher" or "greater" aluminum content are references to larger values of x, relatively speaking, and references to "lower" or "less" aluminum content refers to lower relative values of x, including a value of x=0, such as, by way of example, for the second layer.

Figure 1:
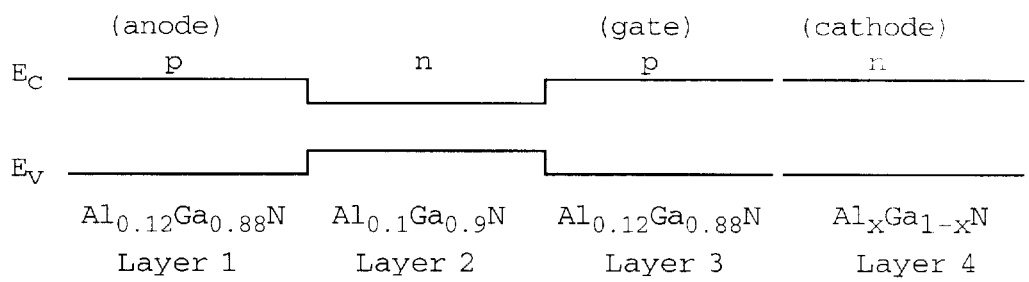
FIG. 1 is an energy diagram illustrating the relative valence band and conduction band energies of the four layer structure of exemplary devices in accordance with an embodiment of the invention.

Now referring to FIG. 1, an energy diagram for one embodiment of the present invention may be seen. In this diagram, the valence band energies $E_v$ and conduction band energies $E_v$ are shown for the four layers of a pnpn device representative of an embodiment of the present invention. As may be seen in the Figure, layer 2 in this embodiment, an $Al_{0.1}Ga_{0.9}N$ layer, has a lower aluminum content than either layers 1 or 3. In that regard, in the specific embodiment illustrated in FIG. 1, layers 1 and 3 have substantially the same aluminum content. Specifically, each layer is approximately $Al_{0.12}Ga_{0.88}N$, though the present invention is not so restricted, as layer 3 could have more or less aluminum than layer 1, as desired. Similarly, layer 4 in FIG.

1, for purposes of specificity in the illustration only, is shown as having the same valence band and conduction band energy levels as layer 3, though the material of layer 4 is only identified as aluminum gallium nitride generally ($Al_xGa_{1-x}N$). Layer 4 may have the same aluminum content as layer 3 (suggested by the same energy level for layers 3 and 4 in FIG. 1) or may have a higher or lower aluminum content than layer 3, as desired or as selected for a specific application.

As may be seen in FIG. 1, the lower aluminum content in layer 2 in comparison to layers 1 and 3 provides a higher valence band energy than layers 1 and 3 and a lower conduction band energy for layer 2 than layers 1 and 3 The difference in hole and electron energies (band offsets) across the interface between aluminum gallium nitride and gallium nitride are such that hole and electron transfer are enhanced from aluminum gallium nitride to gallium nitride, or hole and electron transfer are suppressed from gallium nitride to aluminum gallium nitride. Aluminum content in layers 1 and 2 is chosen such that hole transfer in the forward biased conduction state of the device is enhanced, and suppressed in the reverse biased blocking state of the device. Aluminum content in layers 2 and 3 is chosen such that hole transfer in the forward biased blocking state of the device is suppressed, which reduces leakage current and enhances hole transfer into layer 2 when the device is changing from the forward biased blocking state to the forward biased conduction state. Thus, the device may be characterized as having a low leakage current when off or reverse biased, and a very low voltage drop across the device when forward biased and in the conducting state, providing a very low power dissipating device.

Figure 2:
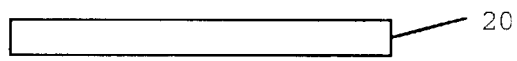
FIGS. 2 through 4 illustrate one method of fabrication of devices of the present invention.
Figure 3:
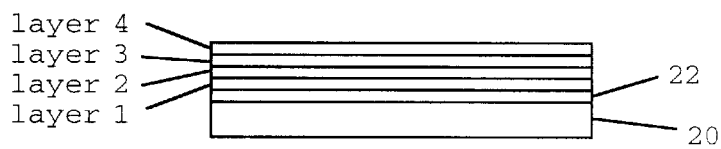

Fabrication of the thyristor-like devices of the present invention may proceed in various ways. By way of one example, as illustrated in FIG. 2, a substrate 20 on which the various layers will be grown is first provided. This substrate may preferably be a sapphire substrate, though other materials may also be used, such as by way of example a silicon carbide substrate. Then a plurality of monocrystalline layers are successively grown on the substrate using molecular beam epitaxy or chemical vapor deposition. In a specific embodiment, a highly conductive monocrystalline gallium nitride (GaN) layer 22 is first grown. Then the monocrystalline layers 1, 2, 3 and 4 are successively grown, the layers being appropriately doped n and p-type as they are grown. While various dopants may be used, magnesium is preferred for the p-type dopant for layers 1 and 3 and silicon is preferred as an n-type dopant for layers 2 and 4. In growing the doped layers, pn junctions are formed between layers 1 and 2, layers 2 and 3 and layers 3 and 4. The interface between the gallium nitride layer 22 and the aluminum gallium nitride layer 1 provides an ohmic contact between the two layers for providing one contact to the pnpn structure of layers 1 through 4.

Figure 4:
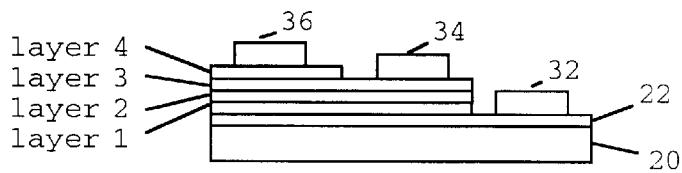

In this exemplary method, after layers 1, 2, 3 and 4 have been grown, these layers are etched in a pattern using conventional techniques, and a layer of metal is deposited and patterned to provide metal contact 32 in ohmic contact with the gallium nitride layer 1. Then layer 4 is locally etched to expose a portion of layer 3, and a layer of metal is deposited and patterned to provide metal contact layer 34, making ohmic contact with layer 3. Then a final metal layer is deposited and patterned to form metal ohmic contact 36 with layer 4. These depositions, patterning, etc. may be done using standard photolithographic techniques well known in the semiconductor industry. Typical contact to layers 1 and 3 with metal layers 32 and 34 is by way of an alloyed NiAu, with the typical contact to layer 4 being an alloyed TiAl, though other materials may be used if desired. The final structure is schematically illustrated in FIG. 4.

Figure 5:
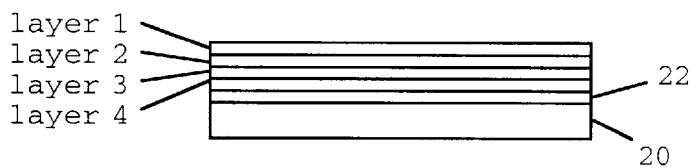
FIGS. 5 and 6 illustrate another method of fabrication of devices of the present invention.
Figure 6:
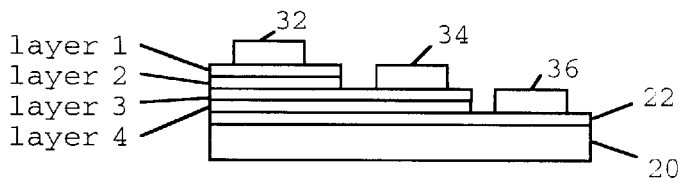

As an alternate method of fabrication of devices in accordance with the present invention, the various doped layers 1 through 4 may be deposited in reverse order, namely layer 4 first, layer 3 second, etc., as illustrated in FIG. 5. In general, the processing would otherwise proceed as with the prior method described, with the exception that layers 1 and 2 are locally etched away to provide access for the metalization layer 34 to make ohmic contact with layer 3 using this method, as opposed to locally etching layer 4 to expose a portion of layer 3 to provide the metallization layer 34 in ohmic contact therewith, as illustrated in FIG. 4.

Figure 7:
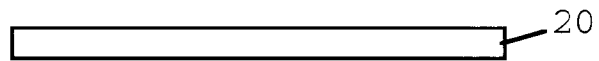
FIGS. 7 through 9 illustrate another method of fabrication of devices of the present invention.
Figure 8:
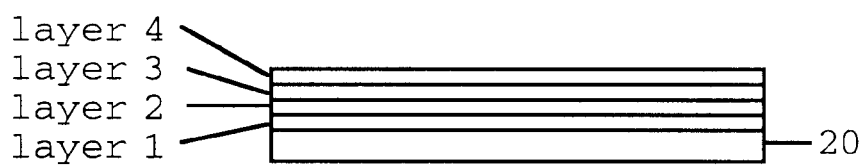
Figure 9:
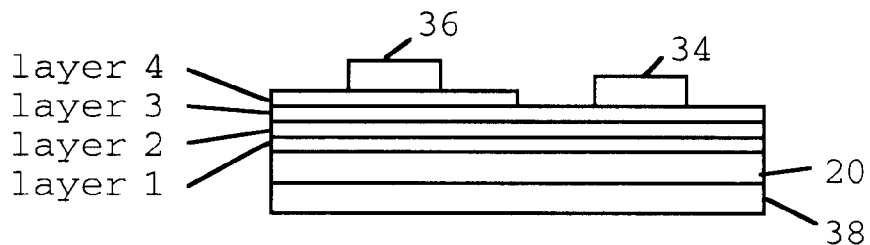
Figure 10:
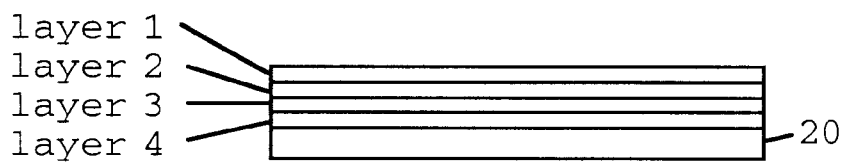
FIGS. 10 and 11 illustrate another method of fabrication of devices of the present invention.
Figure 11:
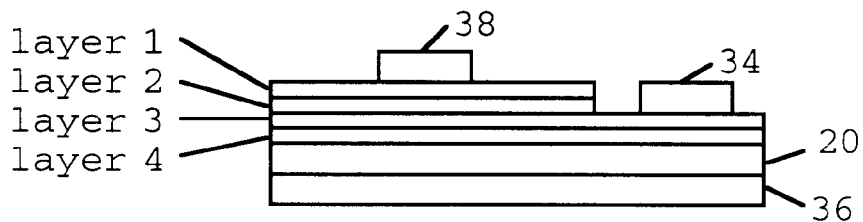

Another exemplary method of fabricating the four layer devices of the present invention is illustrated in FIGS. 7, 8 and 9. Here, the initial substrate 20 shown in FIG. 7 is a highly conductive gallium nitride substrate. The various doped layers of aluminum gallium nitride are then deposited as illustrated in FIG. 8. Thereafter, layer 4 may be etched, and patterned metal layers 34 and 36 formed to provide the gate and cathode contacts, respectively, using conventional techniques. Also, a metal layer 38 is deposited on the underside of the substrate to provide the anode contact thereto. As before, metal layers 34 and 38 may be, by way of example, an alloyed NiAu, with metal layer 36 being, by way of example, an alloyed TiAl. Finally, as before, the various layers may be put down in reverse order, as illustrated in FIG. 10, with the patterned metalization being provided to the desired layers as illustrated in FIG. 11.

As still further alternate embodiments, graded junctions may be used, particularly for the junction between the third and fourth layers. Graded junctions provide a gradual change in composition across the junction, and may be readily formed using techniques well known in the prior art.

There has been described herein four layer pnpn devices with heterojunctions formed between the devices utilizing different compositions and doping of aluminum gallium nitride. The exemplary embodiments have been disclosed and described herein with respect to configurations resembling conventional thyristors. It should be understood, however, that the present invention is equally applicable to other thyristor-like devices such as, by way of example only, diacs and triacs. Also, while specific embodiments illustrated of the gate connection to what is referred to herein as the third layer of the four layer aluminum gallium nitride heterojunction device, the gate connection could be made to both the third and second layers, or as a further alternative, to the second layer only, thereby forming a four layer aluminum gallium nitride heterojunction device having characteristics generally similar to programmable unijunction transistors. Thus, as used herein, the words "thyristor" and "thyristor-like devices" are used in a most general sense to include four or more layered devices which include one or more four layer structures found in thyristors generally. Thus, while certain preferred embodiments and methods of fabrication thereof have been disclosed and described herein, it will be understood by those skilled in the art that various changes in form and detail may be made in the invention without departing from the spirit and scope thereof.

What is claimed is:

1. A triggerable semiconductor device comprising:
   a first layer of $Al_xGa_{1-x}N$ doped to provide a p-type semiconductor layer;
   a second layer of $Al_xGa_{1-x}N$ doped to provide an n-type semiconductor layer;

a third layer of $Al_xGa_{1-x}N$ doped to provide a p-type semiconductor layer; and, a fourth layer of $Al_xGa_{1-x}N$ doped to provide a n-type semiconductor layer;

the second layer having a lower value of x than the first layer;

the third layer having a higher value of x than the second layer; and, the triggerable semiconductor device having first and second connections to the first and fourth layers, respectively, and a gate connection to the third layer.

2. The triggerable semiconductor device of claim 1 wherein the fourth layer has substantially the same value of x as the third layer.

3. The triggerable semiconductor device of claim 1 wherein the fourth layer has a higher value of x than the third layer.

4. The triggerable semiconductor device of claim 1 wherein the fourth layer has a lower value of x than the third layer.

5. The triggerable semiconductor device of claim 1 wherein the value of x in the first layer is approximately 0.12.

6. The triggerable semiconductor device of claim 1 wherein the value of x in the second layer is approximately 0.10.

7. The triggerable semiconductor device of claim 1 wherein the value of x in the third layer is approximately 0.12.

8. The triggerable semiconductor device of claim 1 wherein the value of x in the second layer is approximately 0.10 and the value of x in the third layer is approximately 0.12.

9. The triggerable semiconductor device of claim 8 wherein the value of x in the first layer is approximately 0.12.

10. The triggerable semiconductor device of claim 1 wherein the value of x in the third layer is approximately equal to the value of x in the first layer.

11. The triggerable semiconductor device of claim 1 wherein the value of x in the third layer is less than the value of x in the first layer.

12. The triggerable semiconductor device of claim 1 wherein the value of x in the third layer is larger than the value of x in the first layer.

13. The triggerable semiconductor device of claim 1 wherein the junction between the third and the fourth layer is a graded junction.

14. A four layer semiconductor device comprising:

a first layer of $Al_xGa_{1-x}N$ doped to provide a p-type semiconductor layer;

a second layer of $Al_xGa_{1-x}N$ doped to provide an n-type semiconductor layer;

a third layer of $Al_xGa_{1-x}N$ doped to provide a p-type semiconductor layer; and, a fourth layer of $Al_xGa_{1-x}N$ doped to provide a n-type semiconductor layer;

the second layer having a lower value of x than the first layer;

the third layer having a higher value of x than the second layer; and, the four layer semiconductor device having first and second electrical connections to the first and fourth layers, respectively.

15. The four layer semiconductor device of claim 14 further comprising a gate connection to one of the second and third layers.

16. The four layer semiconductor device of claim 14 wherein the fourth layer has substantially the same value of x as the third layer.

17. The four layer semiconductor device of claim 14 wherein the fourth layer has a higher value of x than the third layer.

18. The four layer semiconductor device of claim 14 wherein the fourth layer has a lower value of x than the third layer.

19. The four layer semiconductor device of claim 14 wherein the value of x in the first layer is approximately 0.12.

20. The four layer semiconductor device of claim 14 wherein the value of x in the second layer is approximately 0.10.

21. The four layer semiconductor device of claim 14 wherein the value of x in the third layer is approximately 0.12.

22. The four layer semiconductor device of claim 14 wherein the value of x in the second layer is approximately 0.10 and the value of x in the third layer is approximately 0.12.

23. The four layer semiconductor device of claim 22 wherein the value of x in the first layer is approximately 0.12.

24. The four layer semiconductor device of claim 14 wherein the value of x in the third layer is approximately equal to the value of x in the first layer.

25. The four layer semiconductor device of claim 14 wherein the value of x in the third layer is less than the value of x in the first layer.

26. The four layer semiconductor device of claim 14 wherein the value of x in the third layer is larger than the value of x in the first layer.

27. The four layer semiconductor device of claim 14 wherein the junction between the third and the fourth layer is a graded junction.

* * * * *